(12) United States Patent
Lai et al.

(10) Patent No.: US 8,517,074 B2
(45) Date of Patent: Aug. 27, 2013

(54) APPARATUS FOR LAMINATING A FILM ON A WAFER

(75) Inventors: Chin-Sen Lai, Taichung (TW); Ming-Tsung Chen, Taichung (TW)

(73) Assignee: C Sun Mfg. Ltd., Taichung (TW)

( * ) Notice: Subject to any disclaimer, the term of this patent is extended or adjusted under 35 U.S.C. 154(b) by 0 days.

(21) Appl. No.: 13/345,756

(22) Filed: Jan. 9, 2012

(65) Prior Publication Data

US 2012/0103531 A1 May 3, 2012

Related U.S. Application Data

(62) Division of application No. 12/699,064, filed on Feb. 3, 2010, now abandoned.

(51) Int. Cl.
*B29C 65/00* (2006.01)
*B32B 37/00* (2006.01)
*B32B 38/04* (2006.01)
*B32B 38/10* (2006.01)

(52) U.S. Cl.
USPC ........................................... 156/517; 156/494

(58) Field of Classification Search
USPC ................. 156/320, 256, 264, 494, 500, 501, 156/517, 521
See application file for complete search history.

(56) References Cited

U.S. PATENT DOCUMENTS
6,689,245 B2 * 2/2004 Tsujimoto ..................... 156/267

* cited by examiner

*Primary Examiner* — Linda L. Gray

(57) ABSTRACT

An apparatus for laminating a film on a wafer includes a cutting mechanism and a laminating mechanism. The cutting mechanism has a cutting device disposed thereon for pre-cutting a dry film. The cutting mechanism has a supporter disposed adjacent to the cutting device for positioning a wafer. The cutting mechanism has a suction member disposed and corresponding to the cutting device for sucking the cut dry film to allow the cutting device pre-cutting the dry film and moving the cut dry film to the supporter. The laminating mechanism has a first lower member provided for positioning the wafer and a first upper member disposed above the first lower member for laminating the cut dry film with electrically heating to adhere the cut dry film on the wafer.

4 Claims, 8 Drawing Sheets

CONCAVE AND
CONVEX LENSES

LAMINATING

EXPOSING

DEVELOPING

CCM STRUCTURE

LAMINATING

EXPOSING/
DEVELOPING

LAMINATING

EXPOSING/
DEVELOPING

COPPER
PLATING

LAMINATING/
EXPOSING/
DEVELOPING/
COPPER PLATING

LAMINATIN/
EXPOSING/
DEVELOPING

COPPER/TIN
PLATING

STRIPPING

REFLOWING

POLISHING

APPARATUS FOR LAMINATING A FILM ON A WAFER

CROSS-REFERENCE TO RELATED APPLICATION

This application is a Divisional Application of Ser. No. 12/699,064, filed 3 Feb. 2010, and entitled "APPARATUS AND METHOD FOR LAMINATING A FILM ON A WAFER", now pending.

BACKGROUND OF THE INVENTION

1. Field of the Invention

The present invention relates to a film laminated on a wafer, and more particularly to an apparatus and a method for laminating a film on a wafer.

2. Description of Related Art

A conventional trimming mechanism for semiconductor wafer in accordance with the prior art comprises a housing, a base received in the housing and horizontally disposed on an inner bottom of the housing, and an upper trimming device received in the housing. The upper trimming device is movably suspended from an inner top of the housing via multiple shafts and is able to move upwardly/downwardly relative to the housing. The upper trimming device includes an annular outer member, an annular inner member, and an annular blade mounted on a bottom thereof. A lower device is received in the housing. The lower device is disposed on a top of the base and corresponds to the upper trimming device for holding a wafer. A supply device is disposed beside the lower device for supplying a protecting film. A take-up device is disposed beside the lower device opposite the supply device for collecting the used protecting film.

When the upper trimming device is operated to move downwardly, the protecting film is laminated on the wafer. The annular blade trims the protecting film around the wafer. However, during trimming, the bleeding resin would not be removed clearly. And afterwards the wafer is moved to another stage for enhancing lamination. The resin may bleed out the wafer again. Therefore, the wafer fabrication may have a low yield.

Furthermore, the wafer has multiple dies disposed on a top thereof. After the protecting film is laminated on the wafer by pressure, a gap is formed between the dies and the wafer. The protecting film should be laminated again for filling the gap. However, the protecting film is fitted on the dies and the wafer such that a surface of the protecting film is uneven.

The present invention has arisen to mitigate and/or obviate the disadvantages of the conventional device.

SUMMARY OF THE INVENTION

The main objective of the present invention is to provide an improved apparatus and an improved method for laminating a film on a wafer.

To achieve the objective, the apparatus for implementing the method for laminating a film on a wafer in accordance with the present invention comprises a cutting mechanism. The cutting mechanism has a cutting device disposed thereon for pre-cutting a dry film. The cutting mechanism has a supporter disposed adjacent to the cutting device for positioning a wafer. The cutting mechanism has a suction member disposed and corresponding to the cutting device for sucking the cut dry film to allow the cutting device pre-cutting the dry film and moving the cut dry film to the supporter. The cutting mechanism has a transporter provided for clamping and extendingly flattening the dry film such that the cut dry film can be replaced. The apparatus in accordance with the present invention has a laminating mechanism is positioned adjacent to the cutting mechanism. The laminating mechanism is provided for laminating the cut dry film on the wafer. The laminating mechanism has a first lower member provided for positioning the wafer and a first upper member disposed above the first lower member for laminating the cur dry film with electrically heating for adhering the cut dry film on the wafer. The apparatus in accordance with the present invention has a flattening mechanism disposed adjacent to the laminating mechanism. The flattening mechanism is provided for flattening the adhered dry film on the wafer, the flattening mechanism having a second lower member provided for positioning the filmed wafer and a second upper member disposed above the second lower member for laminating the adhered dry film on the wafer with electrically heating again to flattening the adhered dry film on the wafer. The apparatus in accordance with the present invention has a protecting mechanism disposed in the laminating mechanism and disposed in the flattening mechanism. The protecting mechanism provides a release film placed between the dry film and the first/second upper member for adhering a material extruded from the dry film and removing the extruded material from the wafer.

The method for laminating a film on a wafer in accordance with the present invention comprises a pre-cutting step: pre-cutting a dry film for fitting a size wafer size; a pre-attaching step: pre-attaching the cut dry film on the wafer for corresponding the cut dry film and the wafer; a laminating step: laminating the cut dry film on the wafer with heating for fixing the cut dry film on the wafer, the laminating step can be provided for rigidly laminating the cut dry film with heating or softly laminating the cut dry film with heating; a flattening step: laminating the cut dry film on the wafer with heating again for flattening the cut dry film on the wafer.

Further benefits and advantages of the present invention will become apparent after a careful reading of the detailed description with appropriate reference to the accompanying drawings.

BRIEF DESCRIPTION OF THE DRAWINGS

FIGS. 6-1 to 6-5 are process views for showing a CCM process;

FIGS. 7-1 to 7-3 are a process views for showing a CMOS process; and

FIGS. 8-1 to 8-10 are process views for showing a RDL process.

DETAILED DESCRIPTION OF THE INVENTION

Figure 1:
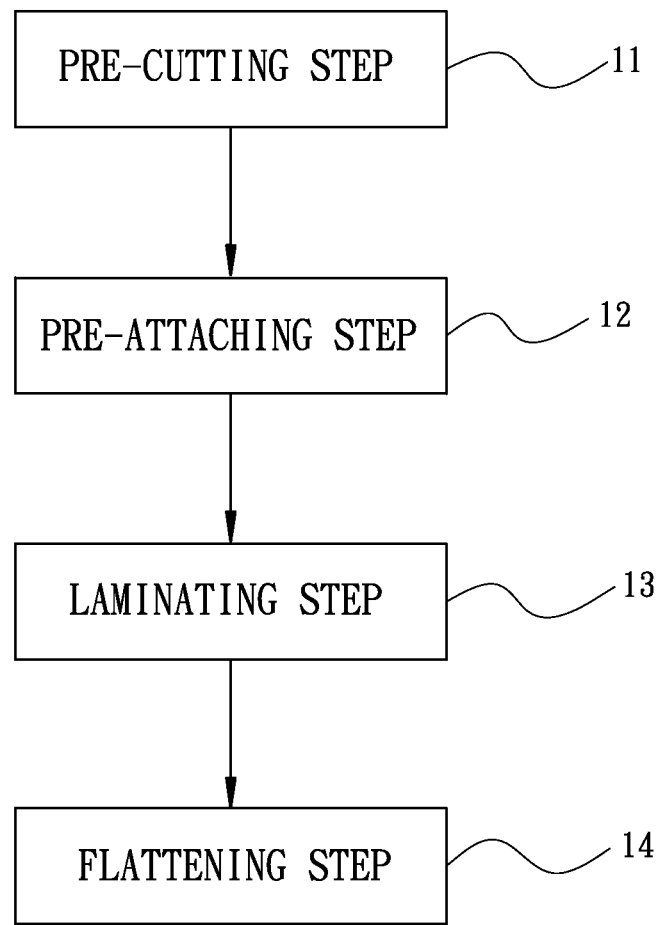
FIG. 1 is a flow chart of a method for laminating a film on a wafer in accordance with the present invention.

Referring to the drawings and initially to FIG. 1, a method for laminating a film on a wafer in accordance with the present invention comprises:

pre-cutting step 11: pre-cutting a dry film for fitting a size of a wafer;

pre-attaching step 12: pre-attaching the cut dry film on the wafer for corresponding the cut dry film and the wafer;

laminating step 13: laminating the cut dry film on the wafer with heating for fixing the cut dry film on the wafer, the laminating step 13 can be provided for rigidly laminating the cut dry film with heating or softly laminating the cut dry film with heating; and flattening step 14: laminating the cut dry film on the wafer with heating again for flattening the cut dry film on the wafer.

Figure 2:
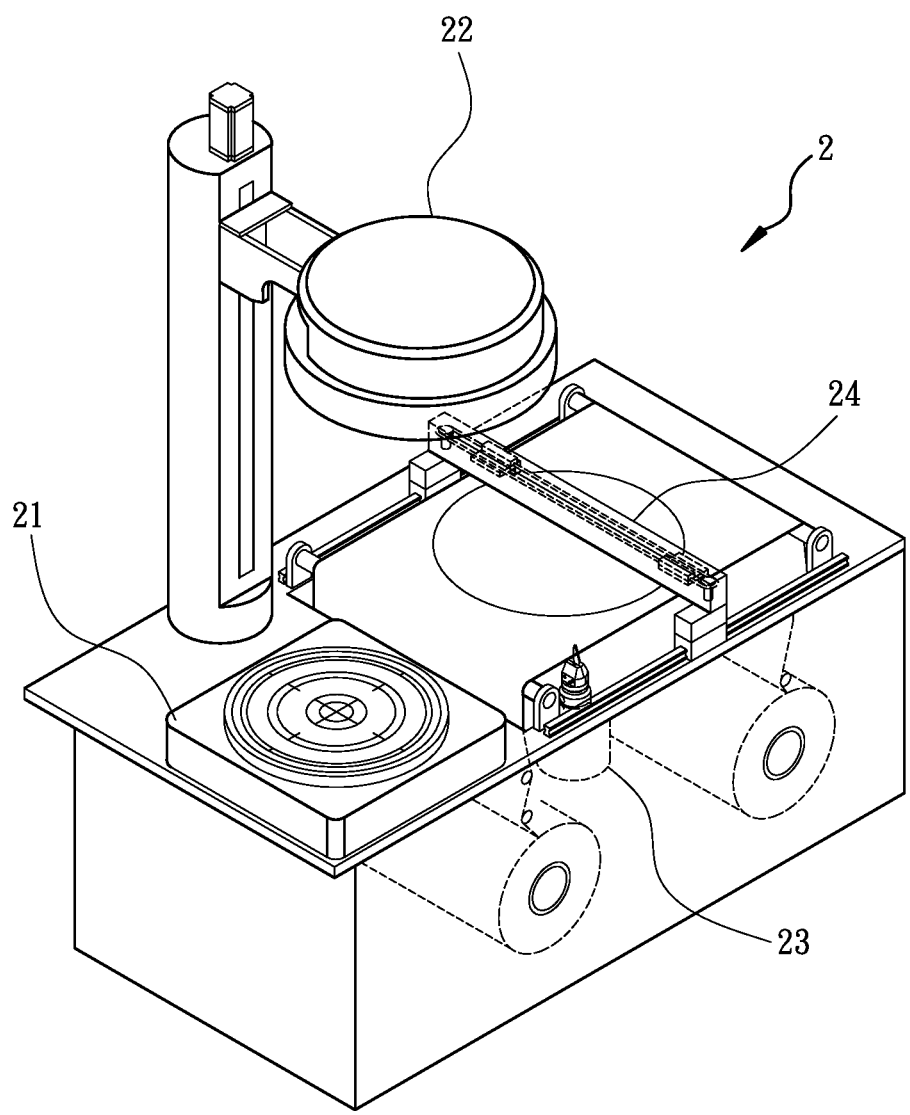
FIG. 2 is a perspective view of a cutting mechanism of a apparatus for laminating a film on a wafer in accordance with the present invention.

Referring to FIGS. 2-5, an apparatus for implementing the method for laminating a film on a wafer in accordance with the present invention comprises a cutting mechanism 2. As shown in FIG. 2, the cutting mechanism 2 has a cutting device 23 disposed thereon for pre-cutting a dry film. The cutting mechanism 2 has a supporter 21 disposed adjacent to the cutting device 23 for positioning a wafer. The cutting mechanism 2 has a suction member 22 disposed and corresponding to the cutting device 23 for sucking the cut dry film to allow the cutting device 23 pre-cutting the dry film and moving the cut dry film to the supporter 21. The cutting mechanism 2 has a transporter 24 provided for clamping and extendingly flattening the dry film such that the cut dry film can be replaced.

Figure 3:
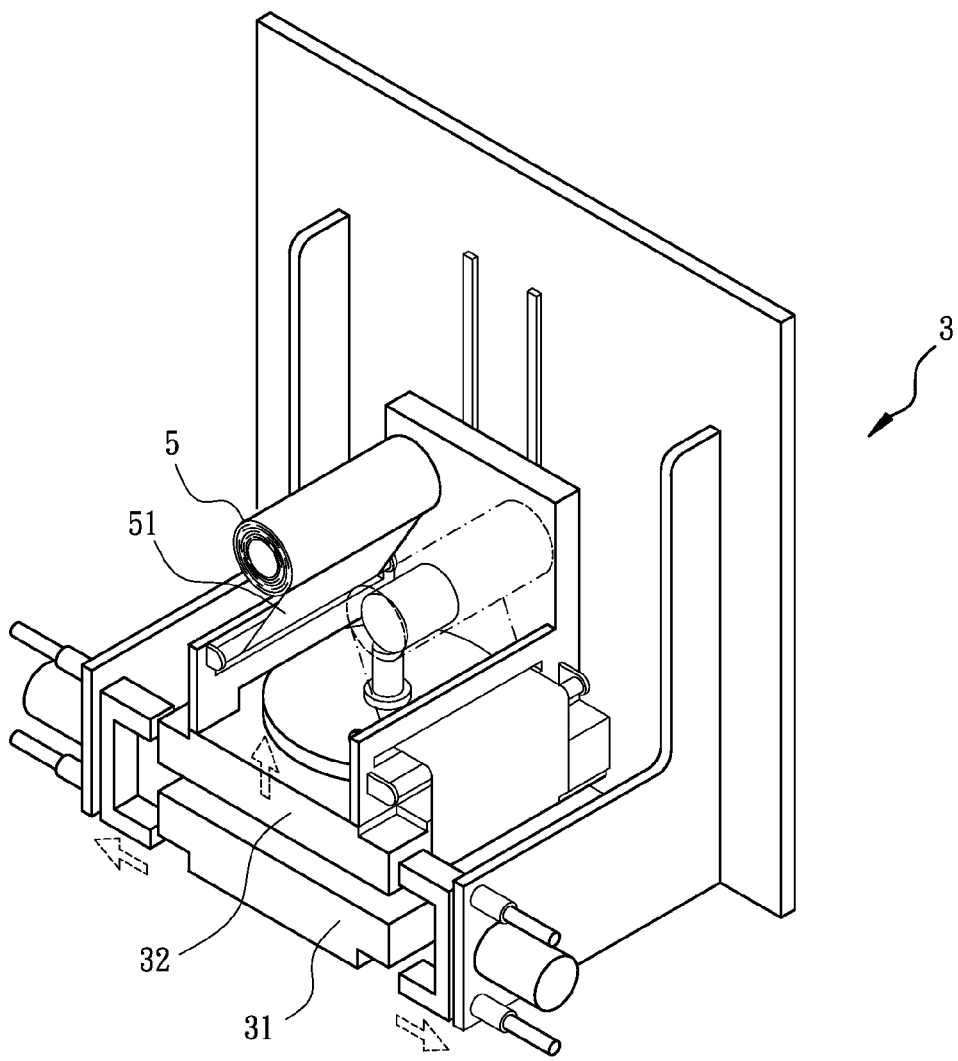
FIG. 3 is a perspective view of a laminating mechanism of the apparatus for laminating a film on a wafer in accordance with the present invention.

As shown in FIG. 3, the apparatus in accordance with the present invention has a laminating mechanism 3 is positioned adjacent to the cutting mechanism 2. The laminating mechanism 3 is provided for laminating the cut dry film on the wafer. The laminating mechanism 3 has a first lower member 31 provided for positioning the wafer and a first upper member 32 disposed above the first lower member 31 for laminating the cur dry film with electrically heating for adhering the cut dry film on the wafer.

Figure 4:
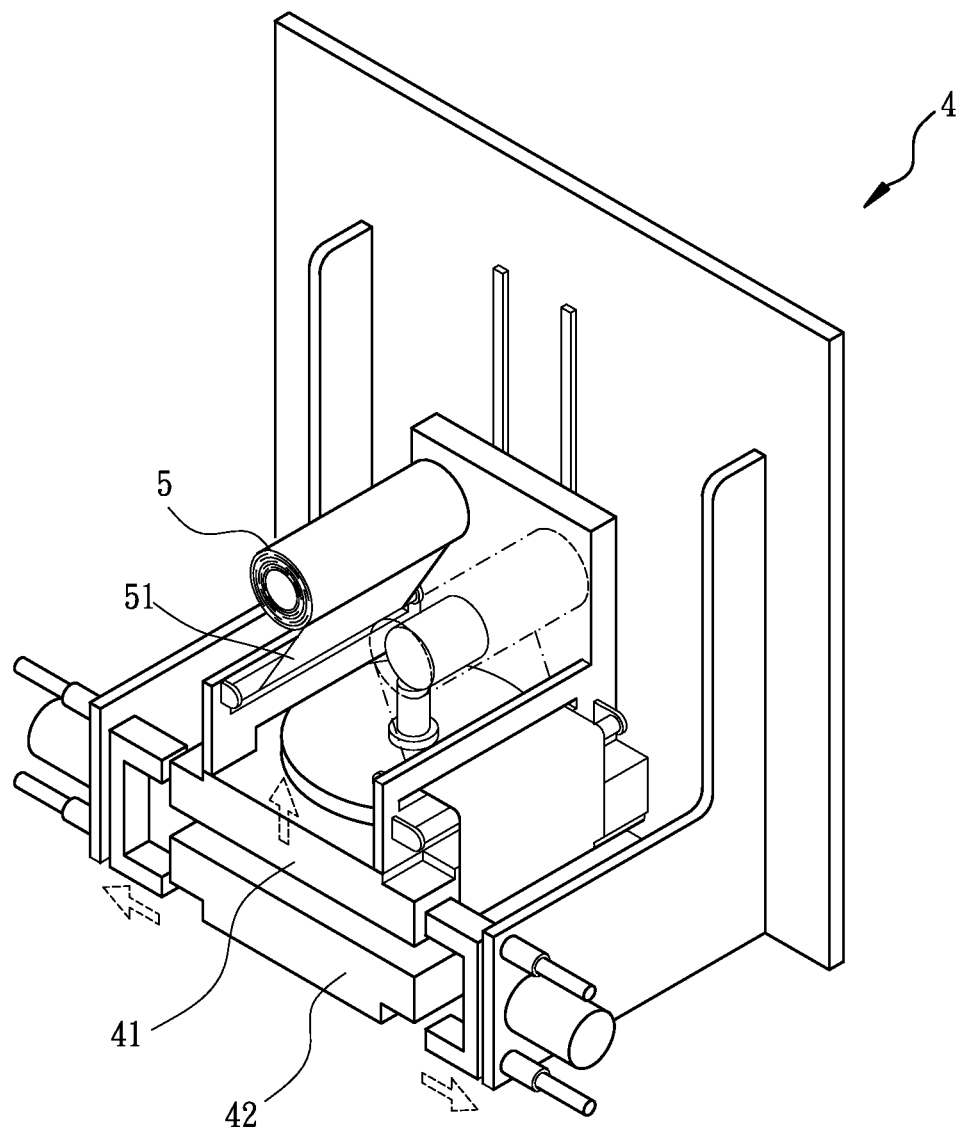
FIG. 4 is a perspective view of a flattening mechanism of the apparatus for laminating a film on a wafer in accordance with the present invention.

As shown in FIG. 4, the apparatus in accordance with the present invention has a flattening mechanism 4 disposed adjacent to the laminating mechanism 3. The flattening mechanism 4 is provided for flattening the adhered dry film on the wafer, the flattening mechanism 4 having a second lower member 42 provided for positioning the filmed wafer and a second upper member 41 disposed above the second lower member 42 for laminating the adhered dry film on the wafer with electrically heating again to flattening the adhered dry film on the wafer.

Referring to FIGS. 3-4, the apparatus in accordance with the present invention has a protecting mechanism 5 disposed in the laminating mechanism 3 and disposed in the flattening mechanism 4. The protecting mechanism 5 provides a release film 51 placed between the dry film and the first/second upper member 41 for adhering a material extruded from the dry film and removing the extruded material from the wafer.

Figure 5:
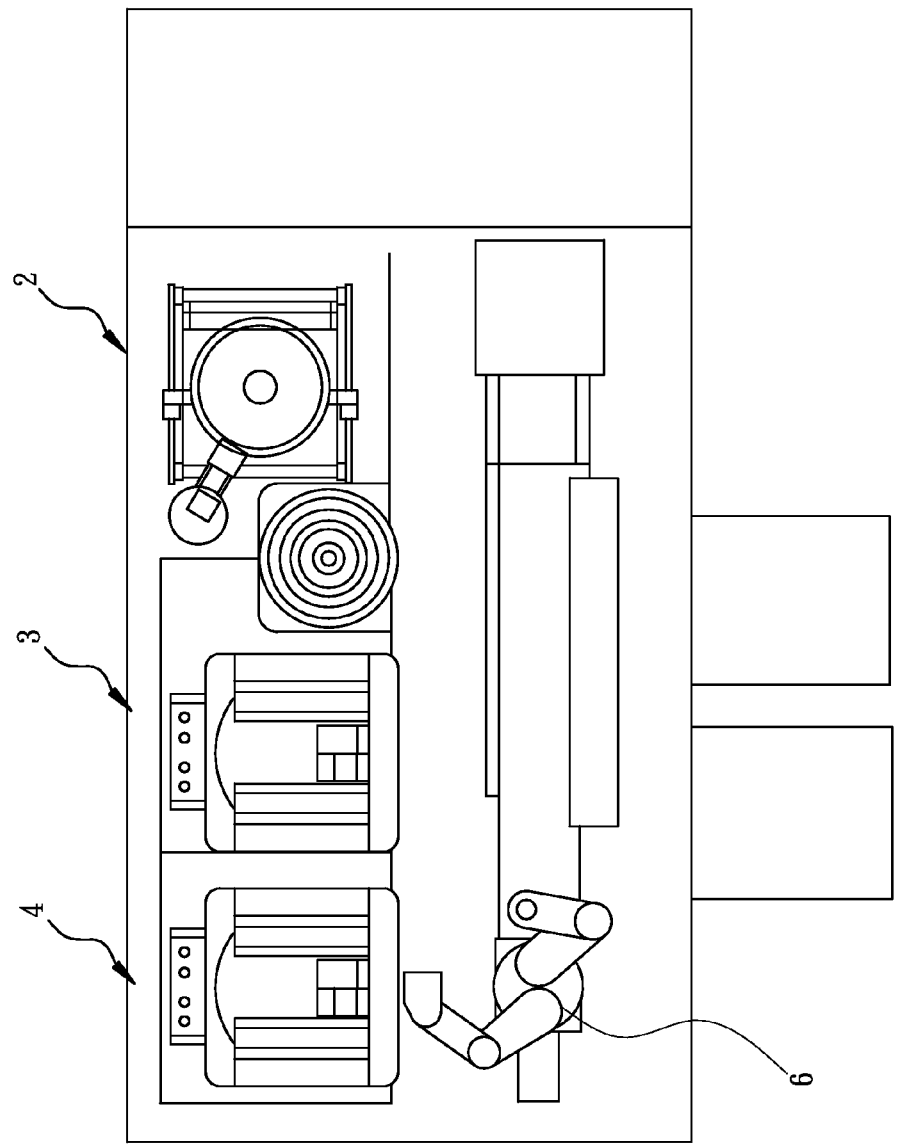
FIG. 5 is a top plane view of a system for arranging various mechanisms of the apparatus for laminating a film on a wafer in accordance with the present invention.

Referring to FIG. 5, the apparatus in accordance with the present invention can be presented to a system is sequentially composed of the cutting mechanism 2, the laminating mechanism 3, and the flattening mechanism 4. The system has a manipulator 6 disposed therein for transporting the wafer to the various mechanisms.

The method and the apparatus for implementing the method in accordance with the present invention are provided for pre-cutting a dry film corresponding to a size of a wafer and then pre-attaching the dry film on the wafer. This improves the defects of pre-attaching the dry film then pre-cutting the dry film of prior art. The transporter of the present invention is provided for flattening the dry film during pre-cutting such that a yield rate is increased. The flattening mechanism is provided for laminating the dry film adhered on the wafer again for keeping a flatness of the dry film. The protecting mechanism is provided for adhering a material extruded from the dry film and removing the extruded material from the wafer.

Figures 1, 6:
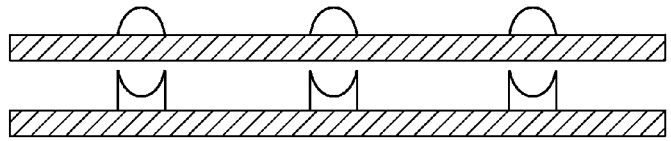
Figures 2, 6:
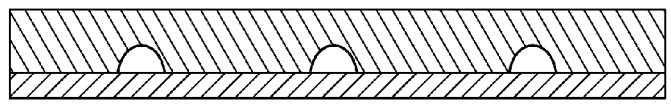
Figures 3, 6:
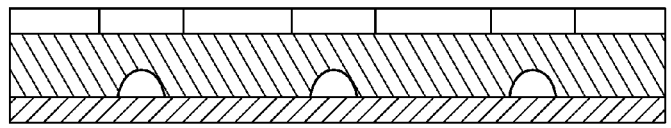
Figures 4, 6:
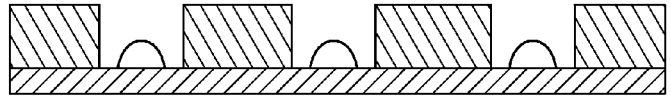
Figures 5, 6:
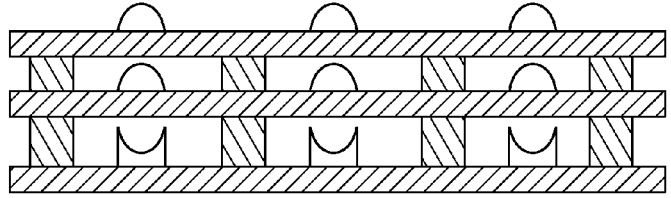
Figures 1, 7:
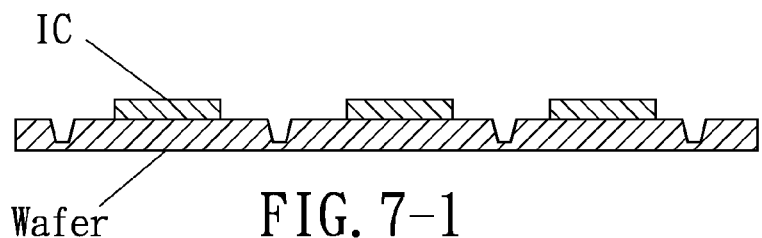
Figures 2, 7:
Figures 3, 7:
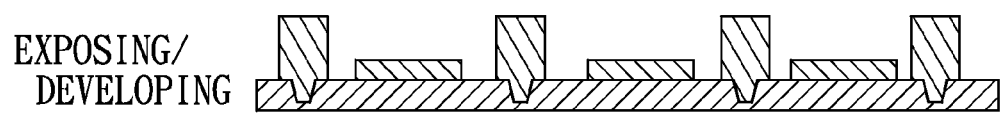
Figures 1, 8:
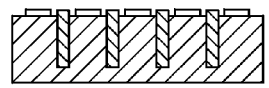
Figures 2, 8:
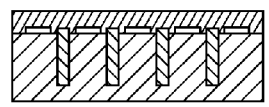
Figures 3, 8:
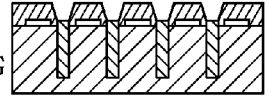
Figures 4, 8:
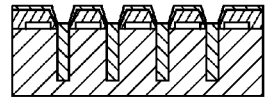
Figures 5, 8:
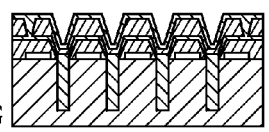
Figures 6, 8:
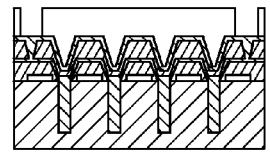
Figures 7, 8:
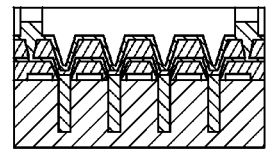
Figure 8:
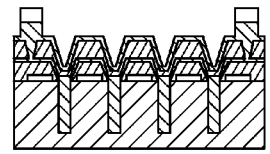
Figures 8, 9:
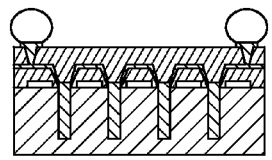
Figures 8, 9, 10:
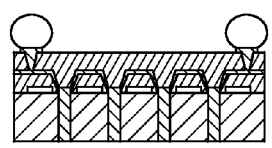

The present invention can be applied to CCM (compact camera module) process, CMOS (complementary metal-oxide semiconductor) process and RDL (redistribution layer) process. As shown in FIGS. 6-1 to 6-5, the CCM process provides for laminating, exposing, developing, and stacking concave and convex lenses to be a CCM structure. As shown in FIGS. 7-1 to 7-3, the CMOS process provides for laminating and exposing/developing a surface of a wafer. As shown in FIGS. 8-1 to 8-10, the RDL process provides for laminating and exposing/developing a surface of a wafer, then copper plating. The RDL process can depend on the process layers for laminating, exposing/developing, copper plating repeatedly. When the final laminating, exposing/developing step are finished, then proceed with copper/tin plating and stripping, and finally reflowing and polishing. All of the CCM process, the COMS process, and the RDL process need laminating step. Therefore, the method and the apparatus in accordance with the present invention can be applied to the CCM process, the CMOS process and the RDL process.

Although the invention has been explained in relation to its preferred embodiment, it is to be understood that many other possible modifications and variations can be made without departing from the spirit and scope of the invention as hereinafter claimed.

What is claimed is:

1. An apparatus for laminating a film on a wafer, comprising:
    a cutting mechanism, the cutting mechanism having a cutting device disposed thereon for adapting to pre-cut a dry film, the cutting mechanism having a supporter disposed adjacent to the cutting device for adapting to position a wafer, the cutting mechanism having a suction member disposed and corresponding to the cutting device for sucking the cut dry film and moving the cut dry film to the supporter;
    a laminating mechanism provided for laminating the cut dry film on the wafer, the laminating mechanism having a first lower member provided for positioning the wafer and a first upper member disposed above the first lower member for laminating the cut dry film with electrically heating to adhere the cut dry film on the wafer; and
    a protecting mechanism disposed in the laminating mechanism, the protecting mechanism providing a release film placed between the dry film and the upper member for adhering a material extruded from the dry film and removing the extruded material from the wafer.

2. The apparatus according to claim 1 further comprising a flattening mechanism provided for flattening the adhered dry film on the wafer, the flattening mechanism having a second lower member provided for positioning the filmed wafer and a second upper member disposed above the second lower member for laminating the adhered dry film on the wafer with electrically heating again to flattening the adhered dry film on the wafer.

3. The apparatus according to claim 1, wherein the cutting mechanism having a transporter provided for clamping and extending the dry film for flattening the dry film.

4. The apparatus according to claim 2 further comprising a protecting mechanism disposed in the flattening mechanism, the protecting mechanism adapted to provide a release film placed between the dry film and the upper member for adhering a material extruded from the dry film and removing the extruded material from the wafer.

* * * * *